United States Patent
Hu et al.

(10) Patent No.: US 9,105,333 B1
(45) Date of Patent: Aug. 11, 2015

(54) ON-CHIP COPYING OF DATA BETWEEN NAND FLASH MEMORY AND RERAM OF A MEMORY DIE

(71) Applicant: SANDISK TECHNOLOGIES INC., Plano, TX (US)

(72) Inventors: Xinde Hu, San Diego, CA (US); Sergey Anatolievich Gorobets, Edinburgh (GB); Manuel Antonio D'Abreu, El Dorado Hills, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/323,910

(22) Filed: Jul. 3, 2014

(51) Int. Cl.
  *G11C 16/04* (2006.01)
  *G11C 13/00* (2006.01)
  *G11C 16/10* (2006.01)
  *H01L 27/115* (2006.01)

(52) U.S. Cl.
  CPC ............ *G11C 13/0069* (2013.01); *G11C 16/10* (2013.01); *H01L 27/115* (2013.01)

(58) Field of Classification Search
  CPC . H01L 27/115; H01L 27/11521; G11C 16/10
  USPC .............. 365/185.05, 148, 158, 63, 171
  See application file for complete search history.

(56) References Cited

U.S. PATENT DOCUMENTS

| | | | |
|---|---|---|---|
| 8,468,434 B2 * | 6/2013 | Toda .............................. | 714/785 |
| 8,589,764 B2 * | 11/2013 | Takeuchi et al. .............. | 714/763 |
| 8,767,440 B2 * | 7/2014 | Parkinson et al. ............. | 365/148 |
| 8,775,905 B2 * | 7/2014 | Nakanishi ..................... | 714/766 |
| 2013/0279249 A1 | 10/2013 | Yun et al. | |
| 2014/0054536 A1 | 2/2014 | Lee | |
| 2014/0068157 A1 | 3/2014 | Makuni et al. | |

* cited by examiner

*Primary Examiner* — Connie Yoha
(74) *Attorney, Agent, or Firm* — Toler Law Group, PC

(57) ABSTRACT

A data storage device includes a memory die, where the memory die includes a NAND flash memory and a resistive random access memory (ReRAM). The memory die also includes an interface coupled to the ReRAM and the NAND flash memory. The interface is configured to support on-chip copying of data between the NAND flash memory and the ReRAM.

20 Claims, 6 Drawing Sheets

ON-CHIP COPYING OF DATA BETWEEN NAND FLASH MEMORY AND RERAM OF A MEMORY DIE

FIELD OF THE DISCLOSURE

The present disclosure is generally related to a memory die that enables on-chip copying of data between a NAND Flash Memory and a resistive random access memory (ReRAM).

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

Some data storage devices may include volatile memory, and data stored in the volatile memory may be lost in the case of power loss. In some data storage devices, a single-bit per cell (also known as single-level cell (SLC)) memory may be used to store data that can persist in the case of power loss. However, SLC memory may have high cost and limited endurance (e.g., data retention).

SUMMARY

The present disclosure describes use of an on-chip resistive random access memory (ReRAM). For example, a memory die may include a NAND flash memory and a ReRAM instead of a SLC. The NAND flash memory and the ReRAM may be connected via an interface (e.g., a bus) that supports on-chip copying of data between the NAND flash memory and the ReRAM. For example, during a write operation, data to be stored in the NAND flash memory may first be stored in the ReRAM. The data may then be copied from the ReRAM to the NAND flash memory via the interface (e.g., the bus). The interface may be a bit-level interface, a parallel byte-level interface, etc. In some cases, the data may be modified in the ReRAM (e.g., to correct an error) prior to being stored at the NAND flash memory. If power loss occurs during copying of the data from the ReRAM to the NAND flash memory, the data may be retained in the ReRAM and may be written to the NAND flash memory when power is restored.

DETAILED DESCRIPTION

Particular embodiments of the present disclosure are described with reference to the drawings. In the description, common features are designated by common reference numbers throughout the drawings.

Figure 1:
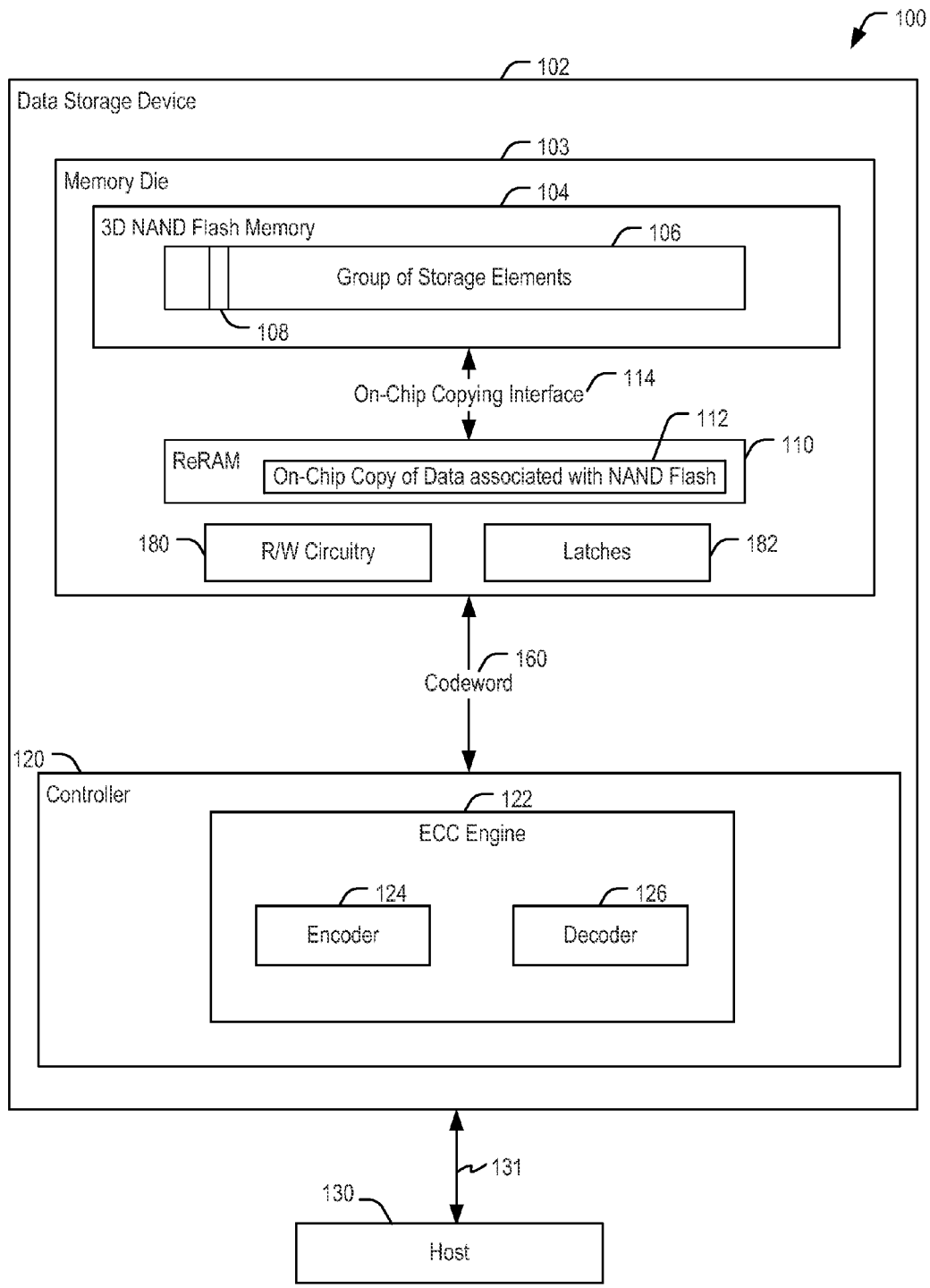
FIG. 1 is a block diagram of a particular illustrative embodiment of a system including a memory die that enables on-chip copying of data between a NAND flash memory and a resistive random access memory (ReRAM)

Referring to FIG. 1, a particular embodiment of a system 100 includes a data storage device 102 coupled to a host device 130 via a host interface 131. The data storage device 102 includes a memory die (e.g., chip) 103. The memory die 103 includes a NAND flash memory 104 coupled to a resistive random access memory (ReRAM) 110 via an interface 114 that supports on-chip copying of data between the NAND flash memory 104 and the ReRAM 110. One or both of the NAND flash memory 104 and the ReRAM may have a three-dimensional (3D) configuration, as further described herein.

The host device 130 may be configured to provide data (e.g., user data) to be stored at the NAND flash memory 104 or to request data to be read from the NAND flash memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 may communicate with the data storage device 102 via a memory interface to cause data to be read from the NAND flash memory 104 and to cause data to be written to the NAND flash memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the data storage device 102 in accordance with any other suitable communication protocol.

The data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the host device 130 may be an enterprise device and the data storage device 102 may be configured to be removably coupled to the host device 130 (e.g., in accordance with a blade or modular storage architecture). To illustrate, the data storage device 102 may be part of an enterprise storage server or service, a network-accessible cloud storage server or service, etc. As yet another example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

One or more of the NAND flash memory 104 or the ReRAM 110 may be a 3D memory. An example of a 3D NAND architecture is described with reference to FIG. 5. An example of a 3D ReRAM architecture is described with reference to FIG. 6. The NAND flash memory 104 includes a group of storage elements 106. The group of storage elements 106, which includes a representative storage element 108, may be arranged in one or more pages, one or more word lines, and/or one or more blocks. For example, the group of storage elements 106 may be divided into multiple word lines, and each of the multiple word lines may include one or more pages (e.g., physical pages). Additionally, each of the multiple word lines may be in a block of the NAND flash memory 104. In a particular embodiment, the storage element 108 corresponds to one or more multi-level cell (MLC) flash cells. Data stored at the NAND flash memory 104 may include one or more error correction code (ECC) codewords. As an illustrative non-limiting example, each ECC codeword may include one or more data bits and one or more parity bits that are appended to the one or more data bits. In some cases, the data that is physically stored at the NAND flash memory 104 may differ from a corresponding ECC codeword due to the occurrence of one or more bit errors, as further described herein.

The NAND flash memory 104 also includes circuitry associated with operation of the storage elements 106, such as read/write circuitry 180 and/or one or more data latches 182. The data latches 182 are configured to store data read from storage elements of the NAND flash memory 104 or to be written to storage elements. The read/write circuitry 180 is configured to control reading of data from storage elements of the NAND flash memory 104 to the data latches 182 or writing of data from the data latches 182 into storage elements of the NAND flash memory 104. The read/write circuitry 180 may also be configured to control storage of data in the ReRAM 110 and transfer of data between the ReRAM 110 and the NAND flash memory 104. It should be noted that although FIG. 1 illustrates the data latches 182 as being distinct from the ReRAM 110, in an alternative embodiment the data latches 182 may not be present. Instead, the ReRAM 110 may represent a single storage media interface between the controller 120 and the NAND flash memory 104.

During a read operation, data may be read from the NAND flash memory 104 and stored in the data latches 182. An on-chip copy of the data read from the NAND flash memory 104 may also be stored in the ReRAM 110 as an on-chip copy 112. As another example, during a write operation, data to be stored in the NAND flash memory 104 may be received at the data latches 182 from the controller 120. Before the data is stored in the NAND flash memory 104, the data may be stored in the ReRAM 110 as the on-chip copy 112. If power is lost or an error occurs during the write to the NAND flash memory 104, the on-chip copy 112 may be used to perform a subsequent write operation at the NAND flash memory 104 after power is restored.

In a particular embodiment, the data latches 182, the ReRAM 110, and the NAND flash memory 104 may be connected via a common interface or bus. Alternatively, the ReRAM 110 may be located between the data latches 182 and the NAND flash memory 104. To illustrate, the ReRAM 110 and the NAND flash memory 104 may be connected via the interface 114 that supports on-chip transfers (e.g., copying) of data between the NAND flash memory 104 and the ReRAM 110. In a particular embodiment, the interface 114 is a bit-level interface that supports bit-level transfer of data between the NAND flash memory 104 and the ReRAM 110. Alternatively, the interface 114 may be a parallel interface that supports transfers of larger chunks of data. For example, the interface 114 may be a byte-level interface that supports byte-level transfer of data between the NAND flash memory 104 and the ReRAM 110. In a particular embodiment, the interface 114 supports transfer of less than all of the data stored in the ReRAM 110 to the NAND flash memory 104. For example, the ReRAM 110 may support storage of an on-chip copy of a portion of a single codeword, a single codeword, multiple codewords, etc.

The controller 120 is configured to receive data and instructions from and to send data to the host device 130 while the data storage device 102 is operatively coupled to the host device 130. The controller 120 is further configured to send data and commands to the NAND flash memory 104 and to receive data from the NAND flash memory 104. For example, the controller 120 is configured to send data and a write command to instruct the NAND flash memory 104 to store the data to a specified address. During the write operation, an on-chip copy of the data to be stored at the NAND flash memory 104 may be stored in the ReRAM 110. To illustrate, the controller 120 may provide the data latches 182 one or more ECC codewords and a destination address of the NAND flash memory 104 where the one or more ECC codewords are to be stored. If the destination address provided by the controller 120 is a logical address, the read/write circuitry 180 may convert the logical address to a physical address (e.g., based on an address translation table). The read/write circuitry 180 may copy the ECC codeword(s) and the destination address from the data latches 182 to the ReRAM 110. The read/write circuitry 180 may then copy the ECC codeword(s) from the ReRAM 110 to the destination address of the NAND flash memory 104 via the interface 114. In a particular embodiment, at least a first portion of the ECC codeword(s) may be copied into the ReRAM 110 while at least a second portion of the ECC codeword(s) are copied to the NAND flash memory 104. The first portion and the second portion may be the same, may be distinct, or may overlap.

As another example, the controller 120 is configured to send a read command to read data from a specified address of the NAND flash memory 104. During the read operation, an on-chip copy of the data read from the NAND flash memory 104 may be stored in the ReRAM 110. To illustrate, the controller 120 may provide an address to the read/write circuitry 180. If the address provided by the controller 120 is a logical address, the read/write circuitry 180 may convert the logical address to a physical address. The read/write circuitry 180 may cause data that is stored in the physical address of the NAND flash memory 104 to be copied into the ReRAM 110 via the interface 114, and then copied from the ReRAM 110 to the data latches 182. In a particular embodiment, at least a first portion of the data may be copied into the ReRAM 110 while a second portion of the data is copied into the data latches 182. The first portion and the second portion may be the same, may be distinct, or may overlap.

The controller 120 includes an ECC engine 122 that is configured to receive data to be stored to the NAND flash memory 104 and to generate a codeword 160. For example, the ECC engine 122 may include an encoder 124 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 may include a decoder 126 configured to decode data read from the NAND flash memory 104 to detect and correct, up to an error correction capability of the ECC scheme, bit errors that may be present in the data. In a particular embodiment, one or more erroneous bits detected by the ECC engine 122 may be corrected in the ReRAM 110, as further described herein.

During operation, the host device 130 may communicate with the controller 120 to initiate read operations or write operations. During a read operation, the controller 120 may provide the read/write circuitry 180 an address of the NAND flash memory 104 from which data is to be read. In a particular embodiment, the controller 120 may also provide the read/write circuitry 180 with an indication of how much data is to be read (e.g., a length in bytes). The read/write circuitry 180 may cause the data at the read address of the NAND flash memory 104 to be copied into the data latches 182. The data may also be copied, via the interface 114, to the ReRAM 110 as the on-chip copy 112. For example, the data may be copied into the ReRAM 110 before or during copying of the data into the data latches 182. The read/write circuitry 180 may provide the read data, such as the codeword 160, from the data latches 182 to the controller 120. The ECC decoder 126 may perform error detection and correction operations prior to providing error-corrected data to the host device 130. During a write operation, the ECC encoder 124 may encode a codeword 160. The controller 120 may provide the read/write circuitry 180 an address of the NAND flash memory 104 and the codeword 160 that is to be written to the address of the NAND flash memory 104. The codeword 160 may be stored in the data latches 182 and in the ReRAM 110 as the on-chip copy. In a particular embodiment, the codeword 160 may be concurrently stored in the data latches 182 and in the ReRAM 110. The codeword 160 may be copied to the NAND flash memory 104 (e.g., from the ReRAM 110 via the interface 114 or from the data latches 182) to complete the write operation.

In a particular embodiment, the read/write circuitry 180 or another component of the memory die 103 may modify the on-chip copy 112 in the ReRAM 110. As an illustrative non-limiting example, the on-chip copy 112 may be modified in response to detecting error(s) in the on-chip copy 112. The error-corrected data may be provided to the controller 120 (e.g., during a read operation) and/or stored in the NAND flash memory 104 (e.g., during a write operation). Such modification of the on-chip copy 112 may be performed in response to signals from the controller 120, in response to signals from error detection/correction circuitry incorporated into the memory die 103, etc. As an illustrative non-limiting example, the ECC engine 122 may provide an indication of which bits in the codeword 160 are erroneous, and the erroneous bits may be flipped in the ReRAM 110 prior to storage of the codeword 160 in the NAND flash memory 104.

The system 100 of FIG. 1 may thus provide an on-chip ReRAM that stores an on-chip copy of data. For example, the on-chip copy of data may correspond to a copy of data that has been read from a NAND flash memory or data that is to be written to the NAND flash memory. Use of an on-chip ReRAM may provide increased data retention, faster data transfer speed, and reduced power consumption as compared to the use of SLC as a storage media between a controller and the NAND flash memory. If power loss occurs while data is being written to the NAND flash memory, at least a portion of the on-chip copy may be used to complete the write operation when power is restored. Using the on-chip copy to complete the write operation may be faster than initiating another write operation at a host device or a controller.

It should be noted that although one more embodiments may be described herein with reference to performing on-chip copying in conjunction with a read operation or a write operation, such descriptions are not to be considered limiting. On-chip copying of data may also be performed during or in response to other operations. For example, on-chip copying of data from the NAND flash memory 104 to the ReRAM 110, and vice versa, may be performed as part of a garbage collection or wear leveling process.

Figure 2:
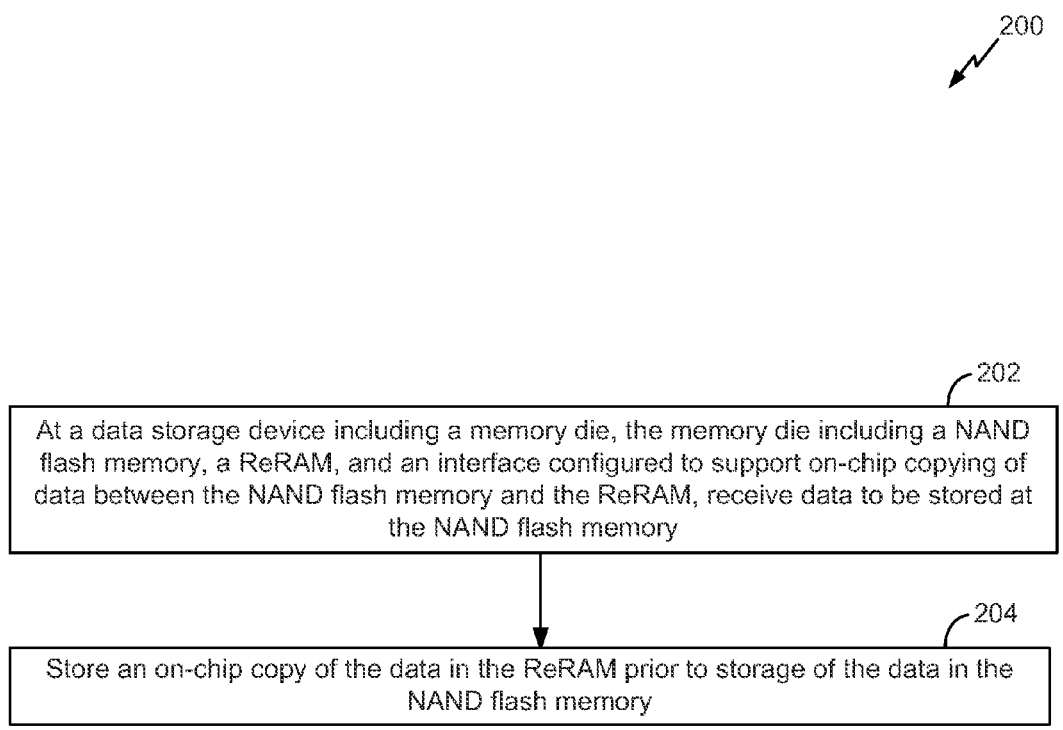
FIG. 2 is a flow diagram of an illustrative embodiment of a method of operation at the system of FIG. 1.

Referring to FIG. 2, a flow diagram of a particular embodiment of a method 200 of operation at the data storage device 102 of FIG. 1 is shown. The method 200 includes receiving data to be stored in a NAND flash memory, at 202. The NAND flash memory may be on a memory die of a data storage device, where the memory die also includes a ReRAM and an interface configured to support on-chip copying of data between the NAND flash memory and the ReRAM. For example, in FIG. 1, the read/write circuitry 180 and/or the data latches 182 may receive data, such as the codeword 160, to be stored in the NAND flash memory 104. The data may be received from a controller (e.g., the controller 120).

The method 200 also includes storing an on-chip copy of the data in the ReRAM prior to storage of the data in the NAND flash memory, at 204. For example, in FIG. 1, the codeword 160 may be stored in the ReRAM 110 as the on-chip copy 112 prior to the codeword 160 being stored in the NAND flash memory 104. Storing the on-chip copy of the data in the ReRAM may include retrieving the data from a set of data latches (e.g., the data latches 182) and storing the retrieved data in the ReRAM. In a particular embodiment, the on-chip copy may be modified (e.g., to correct an error) in the ReRAM prior to storing the modified data in the NAND flash memory.

In some cases, a power loss event may occur while data (e.g., first data) is being written from the ReRAM to the NAND flash memory. In response, the data may be rewritten to the NAND flash memory from the ReRAM (e.g., when power is restored), which may be faster than initiating another write operation at an off-chip controller or a host device. During a read operation, an on-chip copy of data (e.g., second data) read from the NAND flash memory may be stored in the ReRAM.

Figure 3:
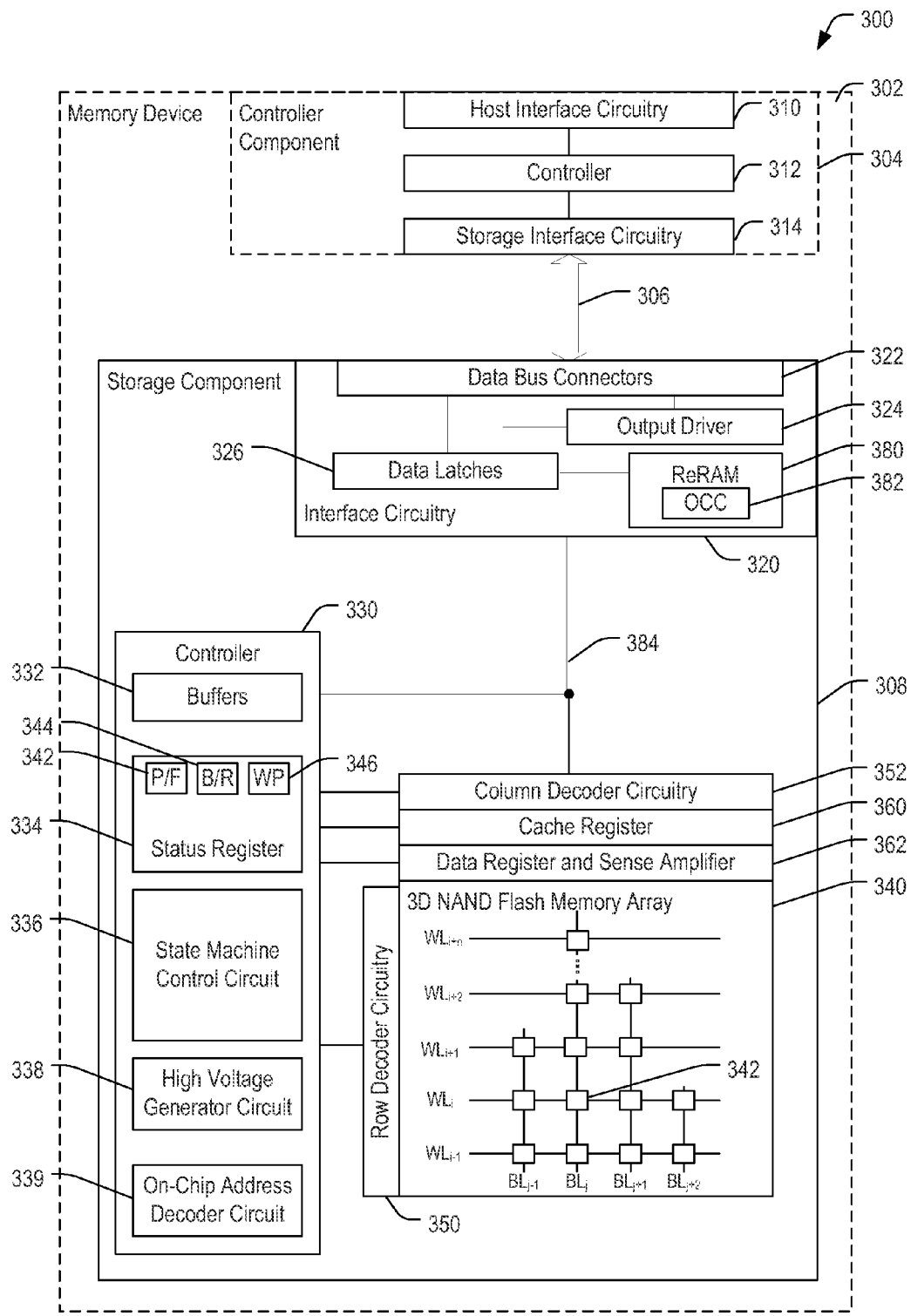
FIG. 3 is a block diagram of another illustrative embodiment of a system including a memory die that enables on-chip copying of data between a NAND flash memory and a ReRAM.

Referring to FIG. 3, an illustrative embodiment of a system 300 is depicted and generally designated 300. The system 300 includes a memory device 302 that includes a controller component 304 coupled to a storage component 308.

In a particular embodiment, the memory device 302 may be the data storage device 102 of FIG. 1. The controller component 304 may include host interface circuitry 310, a controller 312, and storage interface circuitry 314. The controller component 304 may be coupled to the storage component 308 via a bus 306, such as an 8-bit or 16-bit parallel data bus, as an illustrative, non-limiting example. The controller component 304 may communicate instructions and data with an external host (not shown) via the host interface circuitry 310. The controller 312 may be configured to respond to instructions received by the host interface circuitry 310 and may also be configured to send and receive data and instructions to the storage component 308 via the storage interface circuitry 314. The controller component 304 may include or correspond to the controller 120 of FIG. 1.

In a particular embodiment, the storage component 308 includes interface circuitry 320, a controller 330 coupled to the interface circuitry 320, and a 3D memory array 340 accessible to the controller 330. The storage component 308 may include row decoder circuitry 350 and column decoder circuitry 352 that enable access to data stored at one or more particular rows and particular columns of the memory array 340, such as to read a value from or to write a value to a particular memory cell 342 at a bit line BL and at word line WL. A cache register 360 and a data register and sense amplifier 362 may further be coupled to the memory array 340 and may be used to cache or to temporarily store data that is to be written to the memory array 340 or data that has been read out of the memory array 340. In a particular embodiment, the memory array 340 may include a flash memory, such as a NAND flash memory.

In a particular embodiment, the controller 330 includes one or more buffers 332 to store instructions, data, or any combination thereof. The controller 330 may also include one or more status registers 334, a state machine control circuit 336, a high voltage generator circuit 338, and an on-chip address decoder circuit 339. The controller 330 may be coupled to provide electrical signals to the row decoder circuitry 350, to the column decoder circuitry 352, to the cache register 360, and to the data register and sense amplifier 362.

In a particular embodiment, the status register 334 of the controller 330 may include one or more indicators storing values, such as a Pass/Fail (P/F) value 342, a Busy/Ready (B/R) value 344, a write protect (WP) value 346, one or more other indicators, or a combination thereof. The status register 334 may be accessible to the state machine control circuit 336.

The state machine control circuit 336 may include dedicated hardware and circuitry to control an operation of the controller 330 in response to one or more received instructions and internal states, such as may be represented at the status register 334. The state machine control circuit 336 may include states such as a read status state, a data write state, and a data read state, as illustrative, non-limiting examples.

In a particular embodiment, the high voltage generator circuit 338 may be responsive to the state machine control circuit 336 and may be configured to generate a high voltage to program values to, or erase values from, the 3D memory array 340. For example, the 3D memory array 340 may be a flash memory or other memory that may be programmable or erasable via a "high" voltage, such as, for example, five volts (V). The controller 330 may also include the on-chip address decoder circuit 339 that may include hardware and logic circuitry to receive memory address information from the controller component 304 and to decode the memory address information to specific rows and columns to be provided to the row decoder circuitry 350 and the column decoder circuitry 352.

The interface circuitry 320 may include data bus connectors 322, an output driver 324 coupled to the data bus connectors 322, and input/output (I/O) buffers and latches 326. The I/O buffers and latches 326 may be configured to store or to latch data that is received via the data bus connectors 322 or data that is to be written to the data bus 306 via the data bus connectors 322. The I/O buffers and latches 326 may be coupled to a ReRAM 380, which may function as described with reference to the ReRAM 110 of FIG. 1. For example, the ReRAM 380 may store an on-chip copy 382 of data read from the 3D NAND flash memory array 340 and/or data to be written to the 3D NAND flash memory array 340. In a particular embodiment, the ReRAM 380 and the 3D NAND flash memory array 340 may be connected via an interface, such as an illustrative interface 384, that supports on-chip copying of data between the ReRAM 380 and the 3D NAND flash memory array 340. Although the ReRAM 380 is illustrated in FIG. 3 as being external to the interface circuitry 320 and the on-board controller 330 of the storage component 308, in alternate embodiments the ReRAM 380 may be part of the interface circuitry 320 or the controller 330. In a particular embodiment, the storage component 308 corresponds to a single memory die.

The data bus connector 322 may include physical electrical connectors that couple the interface circuitry 320 to the data bus 306. The output driver 324 may include dedicated circuitry and electrical connections to enable the interface circuitry 320 to drive electrical signals over the bus 306. In a particular embodiment, the interface circuitry 320 is configured to comply with one or more bus communications protocols or standards.

Figure 4:
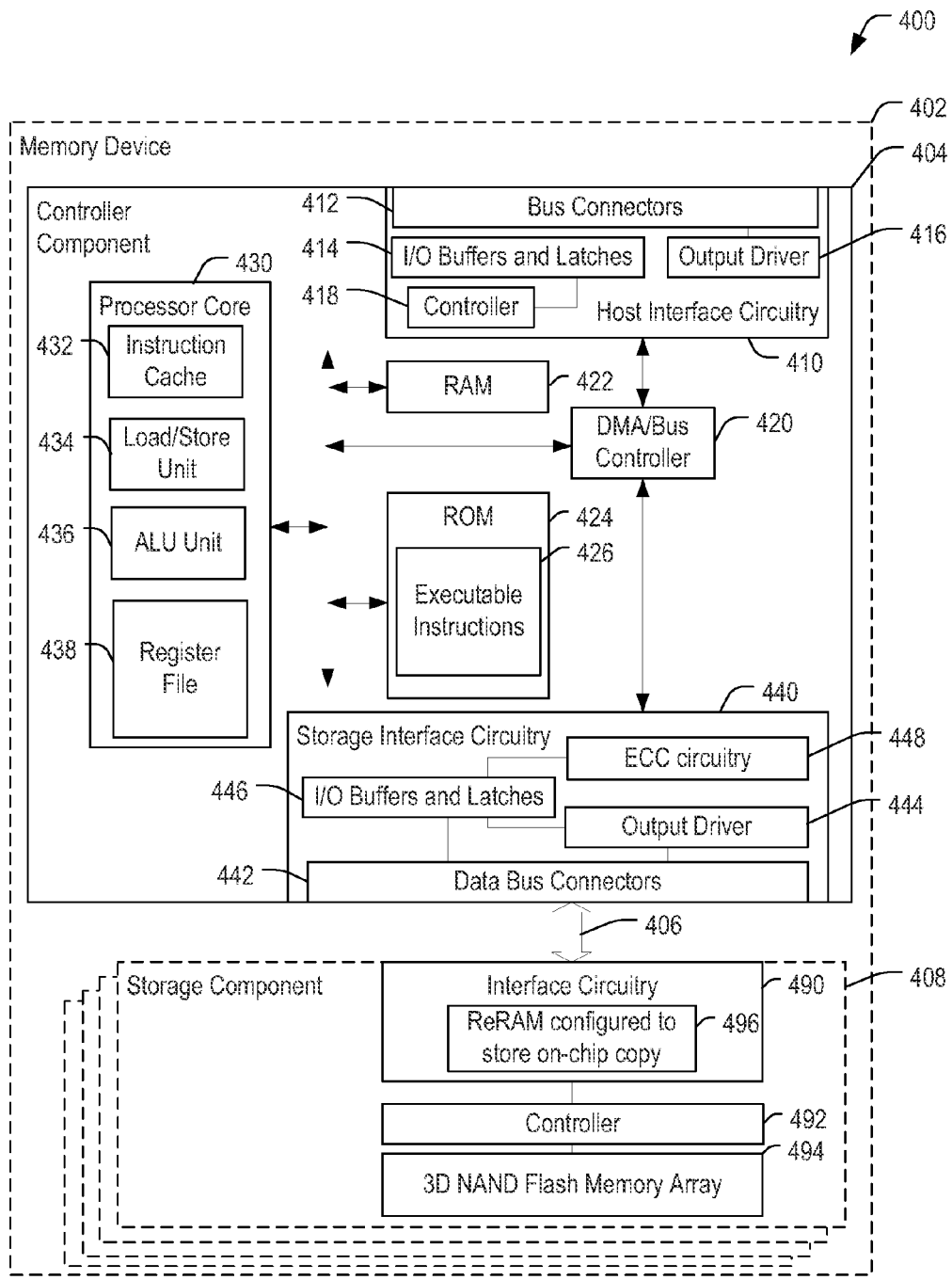
FIG. 4 is a block diagram of another illustrative embodiment of a system including a memory die that enables on-chip copying of data between a NAND flash memory and a ReRAM.

Referring to FIG. 4, an illustrative embodiment of a system is depicted and generally designated 400. The system 400 includes a memory device 402 that includes a controller component 404 coupled to one or more storage components, such as a representative storage component 408 (e.g., corresponding to a single memory die), via a bus 406. In a particular embodiment, the memory device 402 may be the data storage device 102 of FIG. 1.

The representative storage component 408 includes interface circuitry 490 to communicate via the bus 406. The storage component 408 also includes a controller 492 that is coupled to the interface circuitry 490 and that is also coupled to a memory, such as a memory array 494. The memory array 494 may include a 3D NAND flash array. The interface circuitry 490 may include a ReRAM 496 configured to store an on-chip copy of data to be stored in or that has been read from the memory array 494.

In a particular embodiment, the controller component 404 includes host interface circuitry 410 coupled to a direct memory access (DMA)/bus controller 420. The controller component 404 also includes storage interface circuitry 440 that is coupled to the DMA/bus controller 420. A processor core 430, a random access memory (RAM) 422 and a read-only memory (ROM) 424 are coupled to the DMA/bus controller 420 via an internal bus.

In a particular embodiment, the host interface circuitry 410 includes bus connectors 412 coupled to input/output (I/O) buffers and latches 414. The bus connectors 412 are further coupled to output driver circuitry 416. The host interface circuitry 410 also includes a controller 418. In a particular embodiment, the host interface circuitry 410 operates in accordance with a universal serial bus (USB) protocol. For example, the controller 418 may be programmed to receive USB protocol instructions and data from a host device (not shown) via the bus connectors 412 that are coupled to a universal serial bus. The controller 418 may include a hardware processor that executes instructions stored at an internal memory, such as a read-only memory (not shown), to enable receipt and acknowledgment of USB instructions and data. Alternatively, or in addition, the host interface circuitry 410 may be configured to support other communication protocols, such as a Secure Digital (SD) protocol, a small computer system interface (SCSI), parallel interface (SPI), a Compact Flash (CF) protocol, one or more other protocols, or any combination thereof.

In a particular embodiment, the processor core 430 includes an instruction cache 432, a load/store unit 434, an arithmetic logic unit (ALU) unit 436, and a register file 438. The processor core 430 may include, or may function substantially similarly to, an ARM core, as an illustrative, non-limiting example. For example, the processor core 430 may support a reduced instruction set computer (RISC) micro-architecture. The processor core 430 may be configured to retrieve data and executable instructions 426 via the load/store unit 434 from the read only memory 424.

Alternatively, or in addition, at least some of the executable instructions 426 may not be stored at the ROM 424 and may instead be stored at the memory array 494. The executable instructions 426 may be retrieved from the memory array 494 and stored at the RAM 422. The processor core 430 may be configured to retrieve the executable instructions 426 from the RAM 422 for execution.

The executable instructions 426 may be retrieved by the load/store unit 434 and stored to the instruction cache 432. The executable instructions 426 at the instruction cache 432 may be scheduled and provided to one or more execution pipelines, such as an execution pipeline including the ALU unit 436. The ALU unit 436 may include dedicated circuitry to perform arithmetic and logic operations, such as addition and subtraction, AND, NOT, OR, exclusive-OR (XOR), other arithmetic or logic operations, or any combination thereof.

The register file 438 may include multiple memory cells that may provide high speed access to the processor core 430 of data to be used for execution of instructions. One or more memory cells at the register file 438 may be dedicated to store a status indicator. Additional data values, such as values to indicate memory type, memory write status, and write protect status, may also be set during execution of the executable instructions 426 at the processor core 430.

The storage interface circuitry 440 may include data bus connectors 442, an output driver 444, input/output buffers and latches 446, and error correcting code (ECC) circuitry 448. The data bus connectors 442 may include electrical connectors to enable electrical signal propagation via the bus 406. The I/O buffers and latches 446 may be configured to store data that is received via the DMA/bus controller 420 to be transmitted via the bus 406 using electrical signals at the data bus connectors 442 that are generated by the output driver 444. In addition, or alternatively, the I/O buffers and latches 446 may store data values represented by electrical signals received at the data bus connectors 442 via the data bus 406, such as signals generated by the interface circuitry 490 of the storage component 408.

The ECC circuitry 448 may correspond to the ECC engine 122 of FIG. 1 and may include dedicated hardware and circuitry configured to perform operations using data and error correcting code information corresponding to the data that are received as a result of a memory read from the storage component 408, and may perform logical or arithmetic operations to verify that the received data is not detected to have corrupted values. For example, the received data may include additional bits representing an error correcting code, which may be encoded based on values of the data upon storage at the memory array 494. Corruption of one or more bits of the data, or one or more bits of the error correcting code, may be detectable by the ECC circuitry 448. For example, the storage interface circuitry 440 may include a flash memory interface, and the ECC circuitry 448 may be compliant with one or more flash error correcting code protocols.

Figure 5:
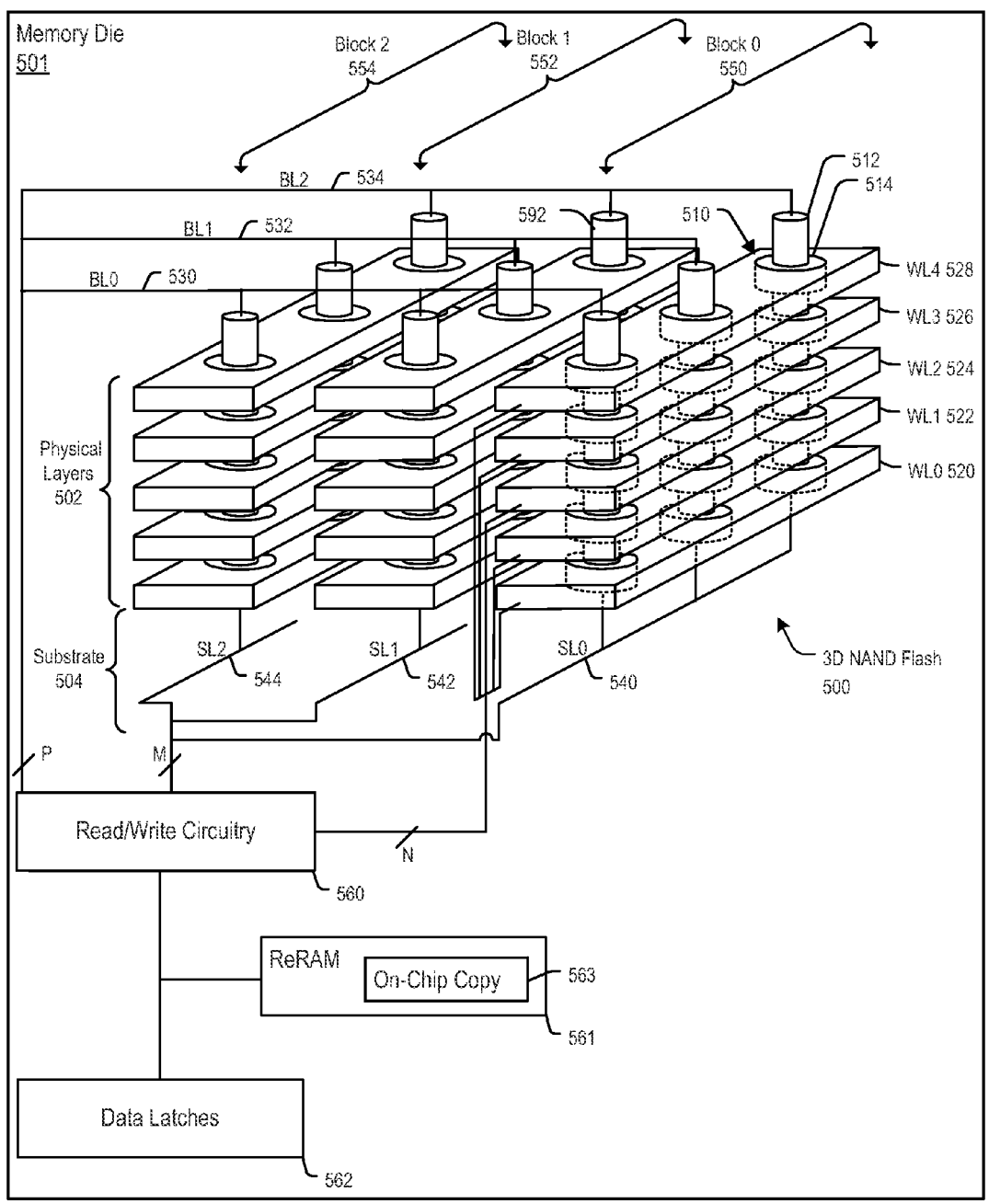
FIG. 5 is a diagram of a memory die that enables on-chip copying of data between a NAND flash memory and a ReRAM.

FIG. 5 illustrates an embodiment of a memory die 501 that includes a 3D memory 500 in a NAND flash configuration. The 3D memory 500 may correspond to the NAND flash memory 104 of FIG. 1. The 3D memory 500 may include one or more groups of physical layers, such as an illustrative group of physical layers 502, that are monolithically formed above a substrate 504, such as a silicon substrate. The physical layers 502 may include at least a subset of the group of storage elements 106. Storage elements (e.g., memory cells), such as a representative memory cell 510, are arranged in arrays in the physical layers.

The representative memory cell 510 includes a charge trap structure 514 between a word line/control gate (WL4) 528 and a conductive channel 512. Charge may be injected into or drained from the charge trap structure 514 via biasing of the conductive channel 512 relative to the word line 528. For example, the charge trap structure 514 may include silicon nitride and may be separated from the word line 528 and the conductive channel 512 by a gate dielectric, such as a silicon oxide. An amount of charge in the charge trap structure 514 affects an amount of current through the conductive channel 512 during a read operation of the memory cell 510 and indicates one or more bit values that are stored in the memory cell 510.

The 3D memory 500 includes multiple erase blocks, including a first block (block 0) 550, a second block (block 1) 552, and a third block (block 2) 554. Each block 550-554 includes a "vertical slice" of the physical layers 502 that includes a stack of word lines, illustrated as a first word line (WL0) 520, a second word line (WL1) 522, a third word line (WL2) 524, a fourth word line (WL3) 526, and the fifth word line (WL4) 528. Multiple conductive channels (having a substantially vertical orientation with respect to FIG. 5) extend through the stack of word lines. Each conductive channel is coupled to a storage element in each word line 520-528, forming a NAND string of storage elements. FIG. 5 illustrates three blocks 550-554, five word lines 520-528 in each block, and three conductive channels in each block for clarity of illustration. However, the 3D memory 500 may have more than three blocks, more than five word lines per block, and more than three conductive channels per block.

Read/write circuitry 560 is coupled to the conductive channels via multiple conductive lines, illustrated as a first bit line (BL0) 530, a second bit line (BL1) 532, and a third bit line (BL2) 534 at a "top" end of the conducive channels (e.g., farther from the substrate 504) and a first source line (SL0) 540, a second source line (SL1) 542, and a third source line (SL2) 544 at a "bottom" end of the conductive channels (e.g., nearer to or within the substrate 504). The read/write circuitry 560 is illustrated as coupled to the bit lines 530-534 via "P" control lines, coupled to the source lines 540-544 via "M" control lines, and coupled to the word lines 520-528 via "N" control lines. Each of P, M, and N may have a positive integer value based on the specific configuration of the 3D memory 500. In the illustrative example of FIG. 5, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 592 and a particular source line may be coupled to the top of the conductive channel 512. The bottom of the conductive channel 592 may be coupled (e.g., electrically coupled) to the bottom of the conductive channel 512. Accordingly, the conductive channel 592 and the conductive channel 512 may be coupled in series and may be coupled to the particular bit line and the particular source line.

The read/write circuitry 560 may operate as described with respect to the read/write circuitry 180 of FIG. 1. For example, data may be stored to storage elements coupled to the word line 528 and the read/write circuitry 560 may read bit values from the storage elements. As another example, the read/write circuitry 560 may apply selection signals to control lines coupled to the word lines 520-528, the bit lines 530-534, and the source lines 540-542 to cause a programming voltage (e.g., a voltage pulse or series of voltage pulses) to be applied across selected storage element(s) of the selected word line (e.g., the fourth word line 528). The read/write circuitry 560 may be coupled to a ReRAM 561 (e.g., corresponding to the ReRAM 110 of FIG. 1) and to data latches 562 (e.g., corresponding to the data latches 182 of FIG. 1).

During a read operation, the controller 120 may receive a request from a host device, such as the host device 130 of FIG. 1. The controller 120 may cause the read/write circuitry 560 to read bits from particular storage elements of the 3D memory 500 by applying appropriate signals to the control lines to cause storage elements of a selected word line to be sensed. Accordingly, the 3D memory 500 may be configured to read from and write data to one or more storage elements. Data read from the 3D memory 500 and data to be written to the 3D memory 500 may also be stored in the ReRAM 561 as the on-chip copy 563, as described with reference to FIGS. 1-2.

Figure 6:
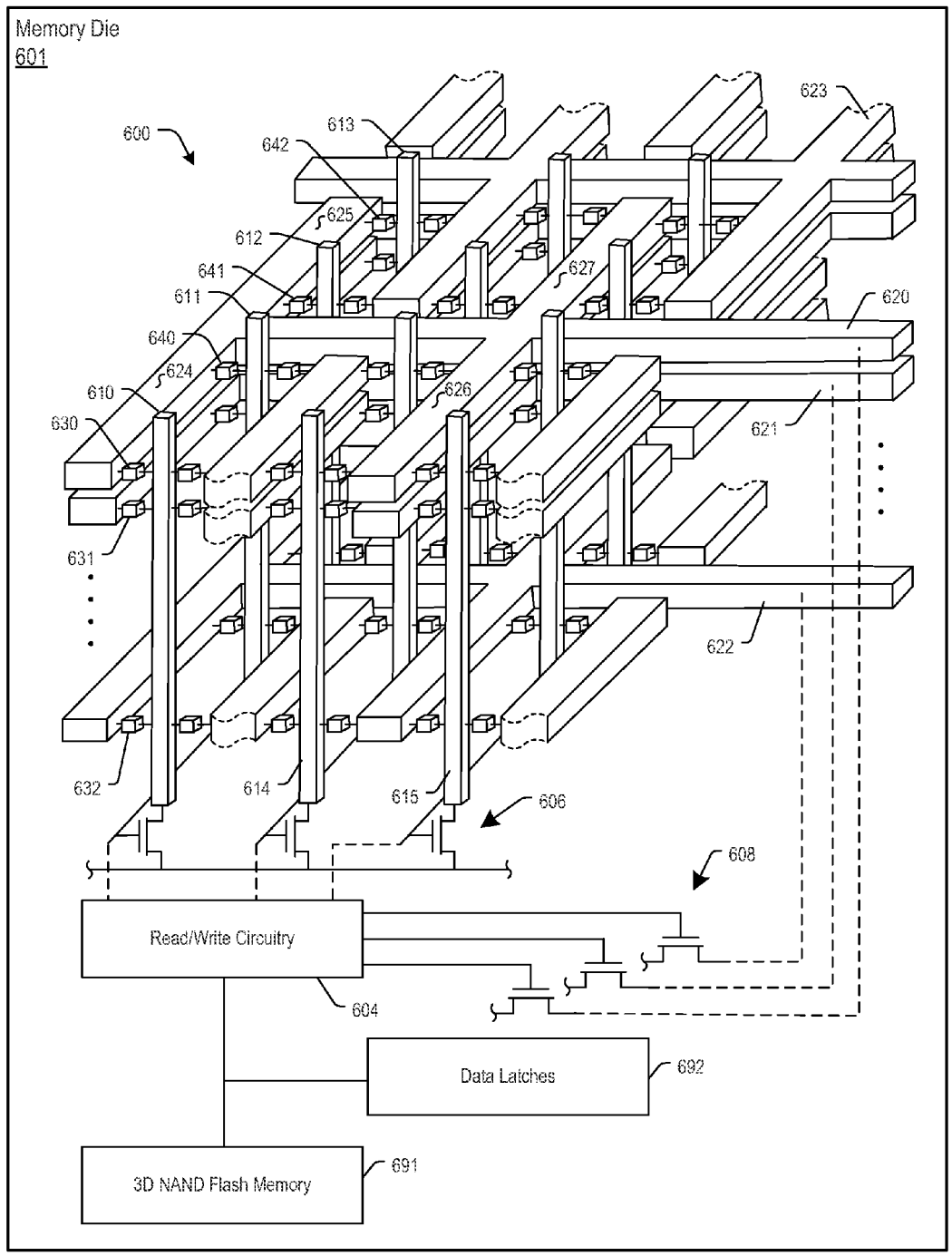
FIG. 6 is a diagram of another particular embodiment of a memory die that enables on-chip copying of data between a NAND flash memory and a ReRAM.

FIG. 6 is a diagram of a particular embodiment of a memory die 601 including a memory 600. The memory 600 may be included in the data storage device 102 of FIG. 1. In the embodiment illustrated in FIG. 6, the memory 600 is a vertical bit line Resistive Random Access Memory (ReRAM). For example, the memory 600 may correspond to the ReRAM 110 of FIG. 1.

The memory 600 includes a plurality of conductive lines in physical layers over a substrate (e.g., substantially parallel to a surface of the substrate), such as representative word lines 620, 621, 622, and 623 (only a portion of which is shown in FIG. 6) and a plurality of vertical conductive lines through the physical layers, such as representative bit lines 610, 611, 612, and 613. The word line 622 may include or correspond to a first group of physical layers and the word lines 620, 621 may include or correspond to a second group of physical layers. The memory 600 also includes a plurality of resistance-based storage elements (e.g., memory cells), such as representative storage elements 630, 631, 632, 640, 641, and 642, each of which is coupled to a bit line and a word line in arrays of memory cells in multiple physical layers over the substrate (e.g., a silicon substrate).

The memory 600 also includes read/write circuitry 604, such as the read/write circuitry 180 of FIG. 1. The read/write circuitry 604 is coupled to word line drivers 608 and bit line drivers 606. The read/write circuitry 604 may also be coupled to a 3D NAND flash memory 691 (e.g., the NAND flash memory 104 of FIG. 1) and to data latches 692 (e.g., the data latches 182 of FIG. 1). In an illustrative embodiment, the memory 600 may store an on-chip copy of data read from the 3D NAND flash memory 691 and/or data to be stored in the 3D NAND flash memory 691.

In the embodiment illustrated in FIG. 6, each of the word lines includes a plurality of fingers (e.g., a first word line 620 includes fingers 624, 625, 626, and 627). Each finger may be coupled to more than one bit line. To illustrate, a first finger 624 of the first word line 620 is coupled to a first bit line 610 via a first storage element 630 at a first end of the first finger 624 and is coupled to a second bit line 611 via a second storage element 640 at a second end of the first finger 624.

In the embodiment illustrated in FIG. 6, each bit line may be coupled to more than one word line. To illustrate, the first bit line 610 is coupled to the first word line 620 via the first storage element 630 and is coupled to a third word line 622 via a third storage element 632.

During a write operation, the controller 120 may receive data from a host device, such as the host device 130 of FIG. 1. The controller 120 may send the data (or a representation of the data) to the memory die 601. For example, the controller 120 may encode the data prior to sending the encoded data to the memory die 601. The data may be stored in the memory 600 as an on-chip copy prior to being stored in the 3D NAND flash memory 691.

The read/write circuitry 604 may write data to storage elements corresponding to a destination of the data. For example, the read/write circuitry 604 may apply selection signals to selection control lines coupled to the word line drivers 608 and the bit line drivers 606 to cause a write voltage to be applied across a selected storage element. For example, to select the first storage element 630, the read/write circuitry 604 may activate the word line drivers 608 and the bit line drivers 606 to drive a programming current (also referred to as a write current) through the first storage element 630. To illustrate, a first write current may be used to write a first logical value (e.g., a value corresponding to a high-resistance state) to the first storage element 630, and a second write current may be used to write a second logical value (e.g., a value corresponding to a low-resistance state) to the first storage element 630. The programming current may be applied by generating a programming voltage across the first storage element 630 by applying a first voltage to the first bit line 610 and to word lines other than the first word line 620 and applying a second voltage to the first word line 620. In a particular embodiment, the first voltage is applied to other bit lines (e.g., the bit lines 614, 615) to reduce leakage current in the memory 600.

During a read operation, the read/write circuitry 604 may read bits from particular storage elements of the memory 600 by applying selection signals to selection control lines coupled to the word line drivers 608 and the bit line drivers 606 to cause a read voltage to be applied across a selected storage element. For example, to select the first storage element 630, the read/write circuitry 604 may activate the word line drivers 608 and the bit line drivers 606 to apply a first voltage (e.g., 0.7 volts (V)) to the first bit line 610 and to word lines other than the first word line 620. A lower voltage (e.g., 0 V) may be applied to the first word line 620. Thus, a read voltage is applied across the first storage element 630, and a read current corresponding to the read voltage may be detected at a sense amplifier of the read/write circuitry 604. The read current corresponds (via Ohm's law) to a resistance state of the first storage element 630, which corresponds to a logical value stored at the first storage element 630.

Although various components depicted in FIGS. 1 and 3-6 are illustrated as block components and described in general terms, such components may include one or more dedicated hardware blocks, state machines, or other circuits configured to enable a data storage device, or components thereof, to perform one or more operations described herein. For example, components of the memory die 103, the NAND flash memory 104, the ReRAM 110, the controller 120, etc., may represent physical components, such as hardware controllers, state machines, logic circuits, or other structures, to enable reading data from and writing data to the NAND flash memory 104.

Alternatively, or in addition, one or more components of the data storage device 102 may be implemented using a microprocessor or microcontroller programmed to perform one or more operations described herein. To illustrate, operations corresponding to the controller 120, the read/write circuitry 180 may be implemented using a processor that executes instructions, as illustrative examples. In a particular embodiment, the instructions are stored at the NAND flash memory 104. Alternatively, or in addition, executable instructions that are executed by the processor may be stored at a separate memory location that is not part of the NAND flash memory 104, such as at a read-only memory (ROM).

Semiconductor memory devices, such as the NAND flash memory 104, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels is initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the NAND flash memory 104 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 and/or the host device 130 may include circuitry, such as read/write circuitry, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate memory controller chip and/or on the same substrate as the memory elements. Thus, in particular embodiments, the NAND flash memory 104 may have a 3D configuration that is monolithically formed in one or more physical levels of arrays of memory cells having an active area disposed above a silicon substrate, where the NAND flash memory 104 includes circuitry associated with operation of the memory cells. Alternatively, or in addition, the ReRAM 110 may have a 3D configuration that is monolithically formed in one or more physical levels of arrays of memory cells having an active area disposed above a silicon substrate, where the ReRAM 110 includes circuitry associated with operation of the memory cells.

One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
a single memory die that includes a NAND flash memory, a resistive random access memory (ReRAM), and an interface coupled to the ReRAM and the NAND flash memory,
wherein the interface is configured to support on-chip copying of data between the NAND flash memory and the ReRAM.

2. The data storage device of claim 1, wherein the ReRAM is configured to store an on-chip copy of the data.

3. The data storage device of claim 2, wherein the data is associated with a read operation performed at the NAND flash memory, and wherein the data is copied from the NAND flash memory to the ReRAM via the interface prior to the data being provided from the ReRAM to a controller of the data storage device.

4. The data storage device of claim 2, wherein the data is associated with a write operation performed at the NAND flash memory, and wherein the data is provided by a controller of the data storage device and written to the ReRAM prior to the data being copied from the ReRAM to the NAND flash memory via the interface.

5. The data storage device of claim 4, wherein the on-chip copy of the data is modified in the ReRAM prior to storage of the modified data in the NAND flash memory.

6. The data storage device of claim 5, wherein the on-chip copy of the data is modified in the ReRAM in response to detecting an error in the data.

7. The data storage device of claim 4, wherein at least a portion of the on-chip copy of the data is written to the NAND flash memory from the ReRAM in response to occurrence of a power loss event during the write operation.

8. The data storage device of claim 1, wherein the ReRAM is used instead of a single-level cell (SLC) memory as a storage media between the NAND flash memory and a controller of the data storage device.

9. The data storage device of claim 1, wherein the memory die further includes data latches, and further comprising a controller configured to send a first codeword to the data latches in association with a write operation and to receive a second codeword from the data latches in association with a read operation.

10. The data storage device of claim 1, wherein the interface includes bit-level connections to enable bit-level transfer of the data between the NAND flash memory and the ReRAM.

11. The data storage device of claim 1, wherein the interface includes a byte-level parallel interface to enable byte-level transfer of the data between the NAND flash memory and the ReRAM.

12. A data storage device comprising:
a controller; and
a single memory die comprising:
a NAND flash memory;
a resistive random access memory (ReRAM); and
an interface coupled to the ReRAM and the NAND flash memory, wherein the interface is configured to support on-chip copying of data between the NAND flash memory and the ReRAM.

13. The data storage device of claim 12, wherein the NAND flash memory has a three-dimensional (3D) configuration that is monolithically formed in one or more physical levels of arrays of memory cells having an active area disposed above a silicon substrate, and wherein the NAND flash memory includes circuitry associated with operation of the memory cells.

14. The data storage device of claim 12, wherein the ReRAM has a three-dimensional (3D) configuration that is monolithically formed in one or more physical levels of arrays of memory cells having an active area disposed above a silicon substrate, and wherein the ReRAM includes circuitry associated with operation of the memory cells.

15. A method comprising:
at a data storage device including a memory die, the memory die including a NAND flash memory, a resistive random access memory (ReRAM), and an interface configured to support on-chip copying of data between the NAND flash memory and the ReRAM, performing:
receiving data to be stored at the NAND flash memory;
storing an on-chip copy of the data in the ReRAM prior to storage of the data in the NAND flash memory;
receiving second data from the NAND flash memory; and storing a second on-chip copy of the second data in the ReRAM.

16. The method of claim 15, further comprising modifying the on-chip copy of the data in the ReRAM prior to storing the modified data in the NAND flash memory.

17. The method of claim 15, wherein the second data is provided to a controller during a read operation.

18. The method of claim 15, further comprising storing at least a portion of the on-chip copy of the data in the NAND flash memory in response to a power loss event.

19. The method of claim 15, wherein the data is received from a controller.

20. The method of claim 15, wherein storing the on-chip copy of the data in the ReRAM comprises retrieving the data from a set of data latches and storing the retrieved data in the ReRAM.

* * * * *